United States Patent [19]

Hashimoto

[11] Patent Number: 4,939,394

[45] Date of Patent: Jul. 3, 1990

[54] SYNCHRONOUS CIRCUIT SYSTEM HAVING ASYNCHRONOUS SIGNAL INPUT

[75] Inventor: Masashi Hashimoto, Garland, Tex.

[73] Assignee: Texas Instruments Incorporated, Dallas, Tex.

[21] Appl. No.: 245,863

[22] Filed: Sep. 16, 1988

[51] Int. Cl.$^5$ ............... H03K 03/26; H03K 19/02
[52] U.S. Cl. ................... 307/480; 307/481; 307/279; 307/290; 307/362
[58] Field of Search ........... 307/443, 480, 481, 272 R, 307/279, 290, 362

[56] References Cited

U.S. PATENT DOCUMENTS 4,785,204  11/1988  Terada et al. ............... 307/481

OTHER PUBLICATIONS

"A 1 Mb Dram with 33 MHz Serial I/O Ports"-Ohta et al., IEEE International Solid-State Circuits Conference, pp. 274-275 (Feb. 21, 1986) with related product description 1 Mbit Image Memory MN4700 Product Description.
"1985 Memory Products Databook"-NEC Electronics Inc., PD41221 224, 000-Bit Serial-Access NMOS RAM, pp. 3-21 through 3-25 (Jan. 1985).
"1986 Memory Databook"-NEC Electronics Inc., PD41221 224,000-Bit Serial-Access NMOS RAM, pp. 3-25 through 3-31 (Apr. 1986).

Primary Examiner—Stanley D. Miller
Assistant Examiner—Margaret Wambach
Attorney, Agent, or Firm—William E. Hiller; N. Rhys Merrett; Mel Sharp

[57] ABSTRACT

A synchronous circuit system comprises a switch circuit for receiving an asynchronous imput signal only within a specified period in response to a synchronizing signal, a latch circuit connected to the switch circuit, a signal transmission circuit connected to the output of the latch circuit and adapted for holding the logic state thereof as before until a necessary input level of the asynchronous input signal is reached, and a feedback circuit connected between the output of the latch circuit and the output of the switch circuit.

11 Claims, 7 Drawing Sheets

INPUT/OUTPUT CHARACTERISTIC
OF TRANSMISSION OF INVERTER ②

INPUT/OUTPUT CHARACTERISTIC
OF TRANSMISSION OF INVERTER ③

SYNCHRONOUS CIRCUIT SYSTEM HAVING ASYNCHRONOUS SIGNAL INPUT

BACKGROUND OF THE INVENTION

1. Field of the Invention

The present invention relates to a synchronous circuit system.

2. Description of the Prior Art

In general electronic circuits are designed on an assumption of synchronous operation. For example, two signals $\phi_1$, $\phi_2$ present in a circuit must be set to such a fixed relation of timing between them that a logic state change of $\phi_1$ is regularly in advance of a logic state change of $\phi_2$.

On the other hand, for asynchronous operation which synchronizes an asynchronous input $\phi_2$ by a synchronous signal $\phi_1$, the relationship between their timings is variable or indefinite.

FIG. 1 diagrams a synchronous circuit which transmits $\phi_2$ synchronously to a contact Ⓐ. The relation of timing in the logic state change as between $\phi_1$ and $\phi_2$ is predetermined, and thus the signal appearing at contact Ⓐ is at an integral "H" level as shown in FIG. 2. On the other hand, owing to an indefinite relation of timing in the logic state change as between $\phi_1$ and $\phi_2$, if their logic state changes (falling and rising) to the reverse state at substantially the same timing by chance, then a very short beard-shaped pulse "P" called "glitch or notch" would appear at contact Ⓐ because the rising (change to "H" level) of $\phi_2$ and the falling (change to "L" level) of $\phi_1$ are offset, as shown in FIG. 3. which may be a cause for erroneous operation of the circuit.

As described above, in one and the same circuit, $\phi_2$ is used as a synchronous signal as much as possible since the use of $\phi_2$ as an asynchronous signal cannot assure the normal operation of the circuit under special conditions. For example, the interface part providing the connection between two units, particularly for receiving external signals and performing the control of the circuit operation is liable to get asynchronized. In the prior art, coping with this problem has the technique involved the use of wherein external signals are allowed to be received under certain conditions permitting their logic state change only within a predetermined time period. This however limits the input timing range of external signals.

OBJECTS AND SUMMARY OF THE INVENTION

It is an object of the present invention to provide a synchronous circuit system so constructed to prevent erroneous operation which may occur at the synchronization of an asynchronous input signal, and thus to provide the security of a stable circuit operation.

For achieving the above-mentioned object, the invention has been accomplished and is concerned with a synchronous circuit system comprising a switch circuit for receiving asynchronously-input signals and transmitting such asynchronous input signals only within a specified time period in response to synchronizing signals, a latch circuit connected to the switch circuit, a signal transmission circuit connected to the output of the latch circuit and adapted to hold the logic state of the data imparted by an asynchronous input signal; as before until a necessary input level of the asynchronous input signal is reached, and a feedback circuit connected between the output of the latch circuit and the output of the switch circuit.

Other objects, features and advantages of the invention will appear more fully from the following detailed description thereof taken in connection with the accompanying drawings.

BRIEF DESCRIPTION OF THE DRAWINGS

In the following drawings, FIGS. 1 through 3 refer to prior art, and FIGS. 4 through 12 show illustrative embodiments of the present invention:

FIG. 4 is a schematic diagram of an equivalent circuit of an embodiment of the synchronous circuit system according to the present invention;

FIG. 6 is the equivalent circuit to an inverter.

FIG. 8 is a schematic diagram of an equivalent circuit showing essential parts of an alternative embodiment of the synchronous circuit system according to the present invention;

FIGS. 9 and 10 are schematic diagrams of equivalent circuits showing essential parts of further alternative embodiments of the synchronous circuit system according to the present invention;

FIG. 11 is a signal timing chart; and

- FIG. 12 is a schematic diagram of a FIFO memory.

DESCRIPTION OF THE PREFERRED EMBODIMENTS

Figure 2:
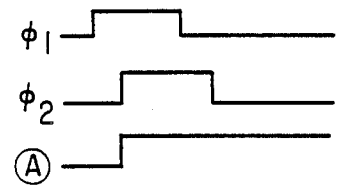
FIGS. 2 and 3 are signal timing charts for the circuit of FIG. 1.
Figure 1:
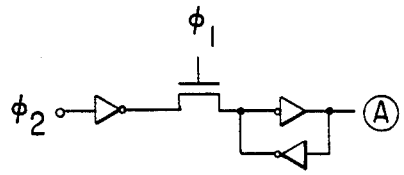
FIG. 1 is a schematic diagram of an equivalent synchronous circuit known in the prior art.
Figure 3:
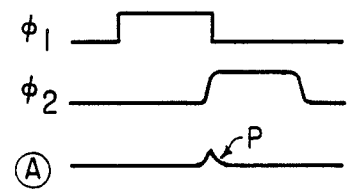
Figure 4:
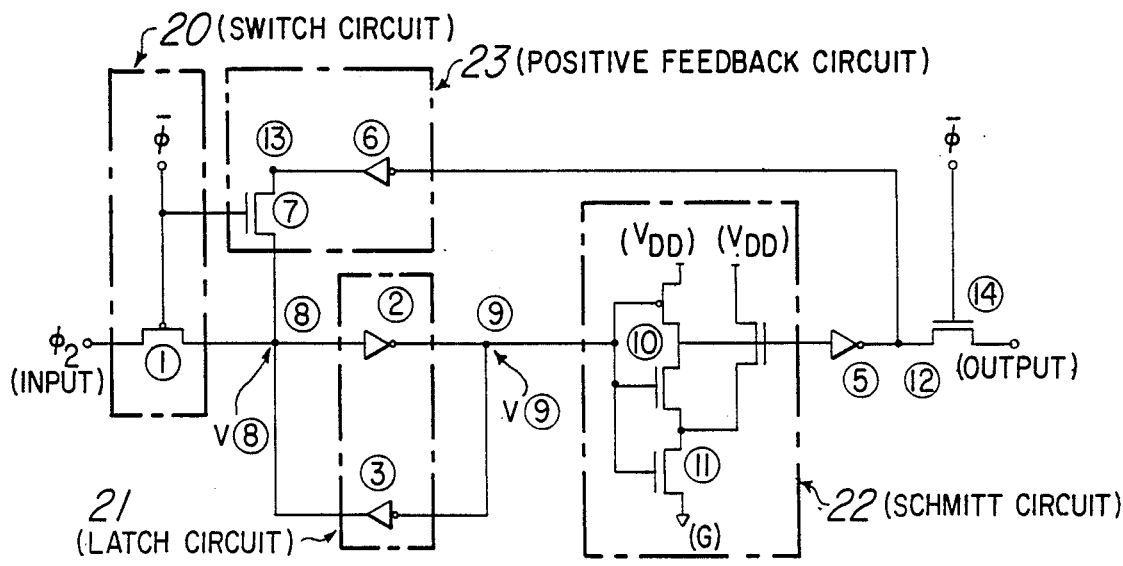

Embodiments of the invention will be described in detail with reference to the accompanying drawings hereinafter:

A synchronous circuit embodying the present invention, as shown in FIG. 4, consists of four component circuits: a switch circuit 20 permitting to receive an asynchronously-input signal $\phi_2$ only within a specified period in response of a synchronizing signal $\bar{\phi}$, a latch circuit 21 connected to the switch circuit, which is responsible for making latched data stable at an integral "H" or "L" level within a definite time, a Schmitt circuit 22 connected to the output of the latch circuit and responsible for holding its state as before until a necessary input level is reached, and a positive feedback circuit 23 connected between the output of Schmitt circuit 22 and the output of switch circuit 20, and so constructed to secure stable operation under the action of the positive feedback circuit 23, even if input signal level was found at the only unstable point of latch circuit 21.

The operation of the synchronous circuit is as follows: Input $\phi_2$ is allowed to be transmitted to a contact Ⓑ, only when a synchronizing signal $\phi$ is at "L" through p-channel MOS transistor ①. From another contact 12, information is is allowed to output through n-channel MOS transistor ⑭, only when $\bar{\phi}$ is at "H". The output changes only with rising $\bar{\phi}$, therefore, even if the input $\phi_2$ changes asynchronously, that is, the output changes in synchronism with with $\bar{\phi}$.

Figure 6:
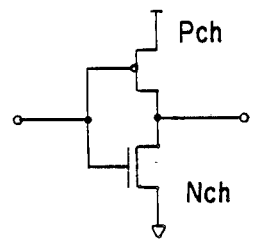

Assuming application of a voltage of $V_{DD}$ to the circuit, the threshold voltage ($V_{th1}$) of an inverter ② which constitutes latch circuit 21 is set to a higher value than $\frac{1}{2} V_{DD}$. In detail, referring to components of the inverter diagrammed in FIG. 6, on the assumption that a p-channel MOS transistor ($P_{ch}$) has a great channel width/channel length ratio of 12/1 and n-channel MOS transistor ($N_{ch}$) has a small value of 4/1 in the ratio, and that threshold value ($V_{th2}$) of inverter ③ is set to a lower value than $\frac{1}{2} V_{DD}$ on conversely to inverter ②. Now about all area excluding the unstable points, if threshold values of both inverters ②, ③ are set, then the potentials of contacts ⑧ and ⑨ will inevitably become $V_{DD}$ or zero within a definite time because inverters ②, ③ have the relation of positive feedback to each other.

Schmitt circuit 22, for which the substrate effect of the MOS transistor, that is, effect controlling threshold value in accordance with substrate potential, is generally used and therefore the explanation of it is omitted. It is important for Schmitt circuit particularly to have a threshold value ($V_{th3}$) set to be higher than the threshold value ($V_{th2}$) of inverter ③, and to be $>\frac{1}{2}V_{DD}$.

The operation under the most strict conditions will be described for making it apparent for the circuit construction according to the invention to enable prevention of the above-stated erroneous operation.

Figure 5A:
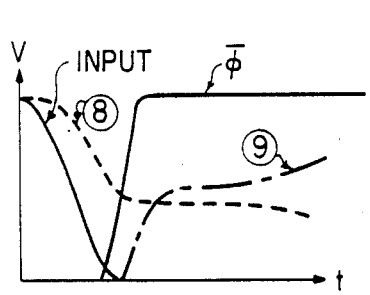
FIGS. 5A and 5B are signal waveform graphs.
Figure 5B:
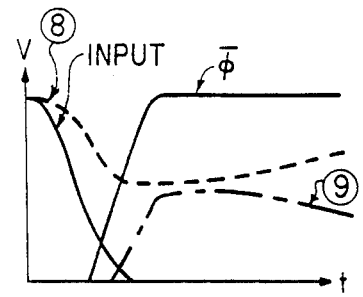

FIGS. 5A and 5B are graphs of voltage waveforms (assuming ideal ones) at main contacts ⑧, ⑨ when $\overline{\phi}$ is rising sharply to change from "L" to "H" during sharp falling of input $\phi_2$, under the condition of lacking in feedback circuit 23. FIGS. 5A and 5B show when the input is finally discriminated as "L" and "H", respectively. It is noteworthy that permanent stay of it at an intermediate level can never occur excluding the unstable point of latch circuit 21 consisting of inverters ②, ③ but it takes considerable time to reach stable state. Change of the output therefore is later than the rising of $\overline{\phi}$, resulting in being out of synchronous state.

The inverter ⑥ and n-channel MOS transistor ⑦ of feedback circuit 23, if they are provided, enables shortening of the unstable state duration as above-described, and enables normal operation under the realistic use conditions making stable also at the unstable point. Concerning the operation at the unstable points, in the latch circuit consisting of inverters ② and ③ stays at an unstable point indicated in FIG. 7C, i.e. $V_b$ (intermediate values) when the input is $V_a$ (intermediate value between 0 and $V_{DD}$). The succeeding Schmitt circuit 22, however, in virtue of setting the threshold to a high value as above-stated, detects intermediate voltage $V_b$, even if it is, as input of 0 level, and thus output of circuit 22 becomes stable "$V_{DD}$". To it, feedback is applied by inverters ⑤ and ⑥, and through the transistor ⑦ contact ⑧ becomes $V_{DD}$. As the result, intermediate value of V ⑧, $V_a$, becomes $V_{DD}$, falls into stable "0". Assuming that when $\overline{\phi}$ changes from "L" to "H", the potential at contact ⑨, V ⑨, is lower than the threshold value of Schmitt circuit 22, then contact ⑬ gets changed to $V_{DD}$, in turn transistor ⑦ turns ON to make the potential at ⑧ rise from an intermediate potential to "H". On the contrary, when the potential at ⑨ is enough high to be not lower than the threshold value of Schmitt circuit 22, the potential at ⑬ becomes changed to 0V, resulting in the falling of the potential at ⑧ to "L", unless it becomes fully fallen towards "L". In this way the potentials at ⑧ and ⑨ become stable in short periods.

Figure 7A:
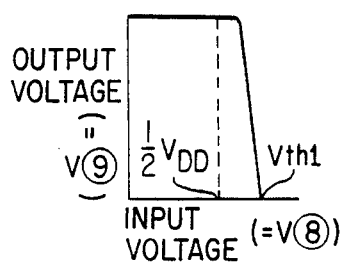
FIGS. 7A, 7B, 7C and 7D are graphs showing output to input characteristics.
Figure 7B:
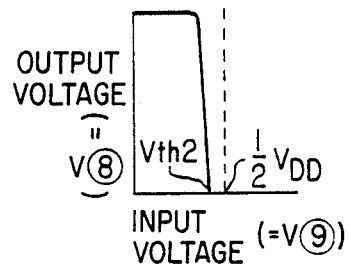
Figure 7C:
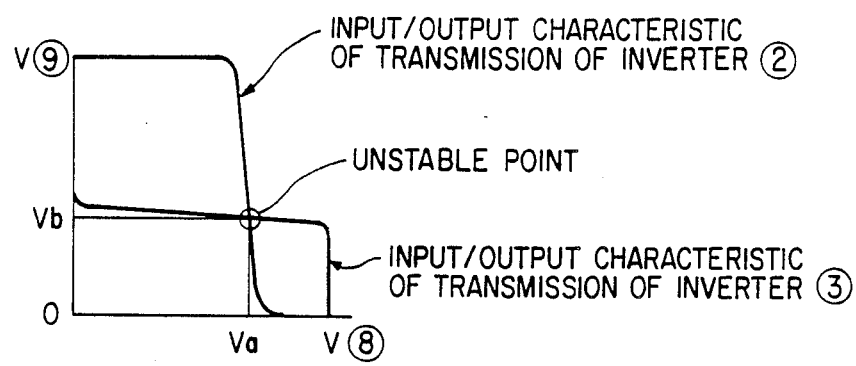
Figure 7D:
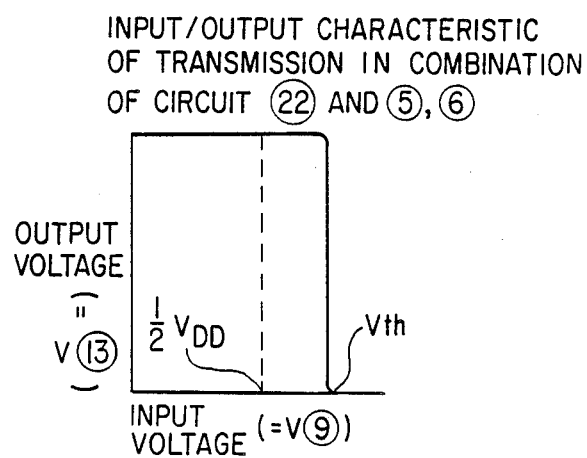

FIGS. 7A and 7B show the output to input characteristics of inverters ②, ③, respectively, and FIG. 7C the synthesized characteristic of both. FIG. 7D is of the synthesized characteristic of the combination of Schmitt circuit 22 and inverters ⑤, ⑥. At unstable point (FIG. 7C) where a fixed potential is found, it becomes inoperative. Getting away from this point, even if it is very slight, the above-mentioned feedback occurs, resulting in reaching to $V_{DD}$ or zero.

Now arises the question that at the time point when Schmitt circuit 22 starts to operate, $\overline{\phi}$ changes to "H", that is, $\phi$ changes to "H" while $\phi_2$ falls to "L". At this time the potential at ⑬ remained "H" and potential at ⑧ has become an intermediate value towards 0V. It follows that when $\overline{\phi}$ changes to "H" and transistor ⑦ turns ON, contacts ⑧ and ⑬ attracts each other, which may cause erroneous operation. When $\overline{\phi}$ gets changed to "H" in response to a pulse due to some external cause, transistor 7 turns ON, and in turn contacts ⑧ and ⑬ attracts each other, output ⑨ in FIG. 5A is reversed, which may result in production of a beard-like pulse.

For the prevention of this difficulty, particularly the Schmitt circuit performs an important part as it will be described below: For removing the interattraction between contacts ⑧ and ⑬, adequate force to make "L" of contact ⑧ reversed may be applied to inverter ⑥ by fulfilling the following conditions:

(1) To make the threshold value of inverter ②, ($V_{th1}$), higher;

(2) To make the threshold value ($V_{th3}$) of Schmitt circuit 22 higher;

(3) To make the electric current drive capability of p-channel MOS transistor of ⑥ smaller than that of n-channel MOS transistor of ③.

Under these conditions, "H" level at ⑨ cannot be detected in Schmitt circuit 22 unless potential at ⑧ becomes considerably low, that is, Schmitt circuit 22 continues hold its state as before until a necessary input level is reached. The current drive capability of ③ must have become stronger at a time point when potential at ⑨ is detected as "H" by Schmitt circuit 22, and in virtue of the formation of the positive feedback circuit, potential at ⑧ becomes lower and lower and potential at ⑨ becomes more and more higher until potential at ⑨ is transmitted to contact ⑬.

In this way, interattraction between contacts ⑧, ⑬ is not caused if transistor ⑦ turns ON when $\overline{\phi}$="H", and therefore no glitch or notch (very short-width pulse signal) is produced.

Besides for the above-mentioned circuit is so constructed that an asynchronous signal is synchronized with an internal signal $\overline{\phi}$, in virtue of this, the limitation on input timing of external signals can be lifted.

Reversion of polarities of transistors ①, ⑦ and ⑭ can cause the above-stated operation at the reversed phase to $\overline{\phi}$.

Figure 8:
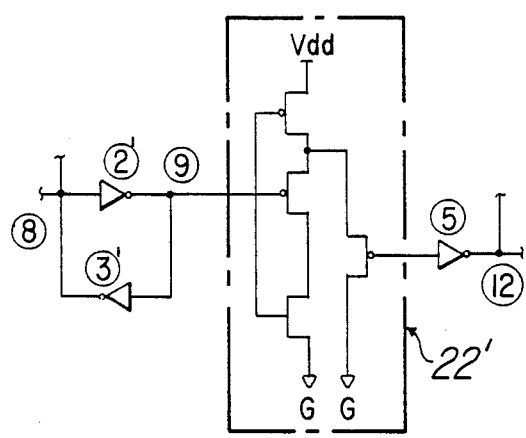

To the rising waveform of input $\phi_2$ can be applied the circuit configuration similar to the above-mentioned, in which as shown in FIG. 8:

instead of inverter ②, an inverter ②' having a smaller threshold value than $\frac{1}{2} V_{DD}$, for example, the width to length ratio of p-channel MOS transistor being set to $\frac{1}{4}$ and that of n-channel MOS transistor to 12/1; and instead of inverter ③, an inverter ③' of higher threshold value than $\frac{1}{2} V_{DD}$ are used. An alternative Schmitt circuit 22' has a threshold value set to a smaller value than that of inverter ③', i.e. to $V_{th3} < \frac{1}{2}V_{DD}$.

In virtue of this, combination with a circuit adaptable for rising and falling phases of input can provide circuits free from disadvantageous or erroneous operation in either rising or falling phases of input.

Figure 9:
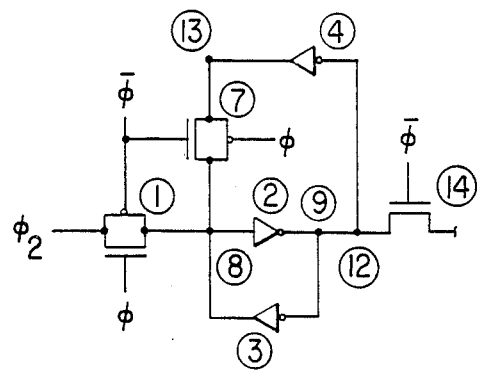

FIG. 9 shows an alternative embodiment of synchronous circuit.

This circuit comprises a CMOS transistor ①  connected to the input, and, instead of Schmitt circuit 22, an inverter ④ having a higher $V_{th}$ and another CMOS transistor ⑦, both of which are connected in the feedback circuit. This configuration can take the same effects as above-described, and particularly as obvious can prevent the above-stated interattraction between ⑬ and ⑧ and occurrence of erroneous operation, by the function of the inverter ④.

Figure 10:
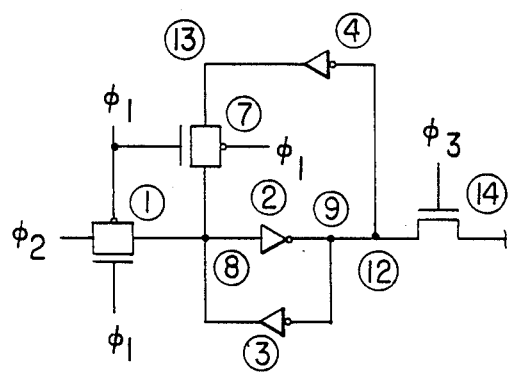
Figure 11:
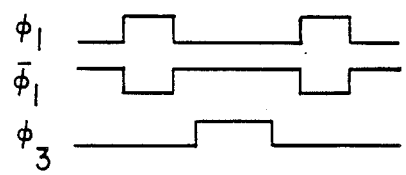

FIG. 10 shows a second alternative embodiment which is distinct from that of FIG. 9 in the fact that in addition to synchronizing signals, a control signal $\phi 3$ of output transistor ⑭ is provided in timing relationship indicated in FIG. 11. Thus an output can be obtained under a suitable timing.

Figure 12:
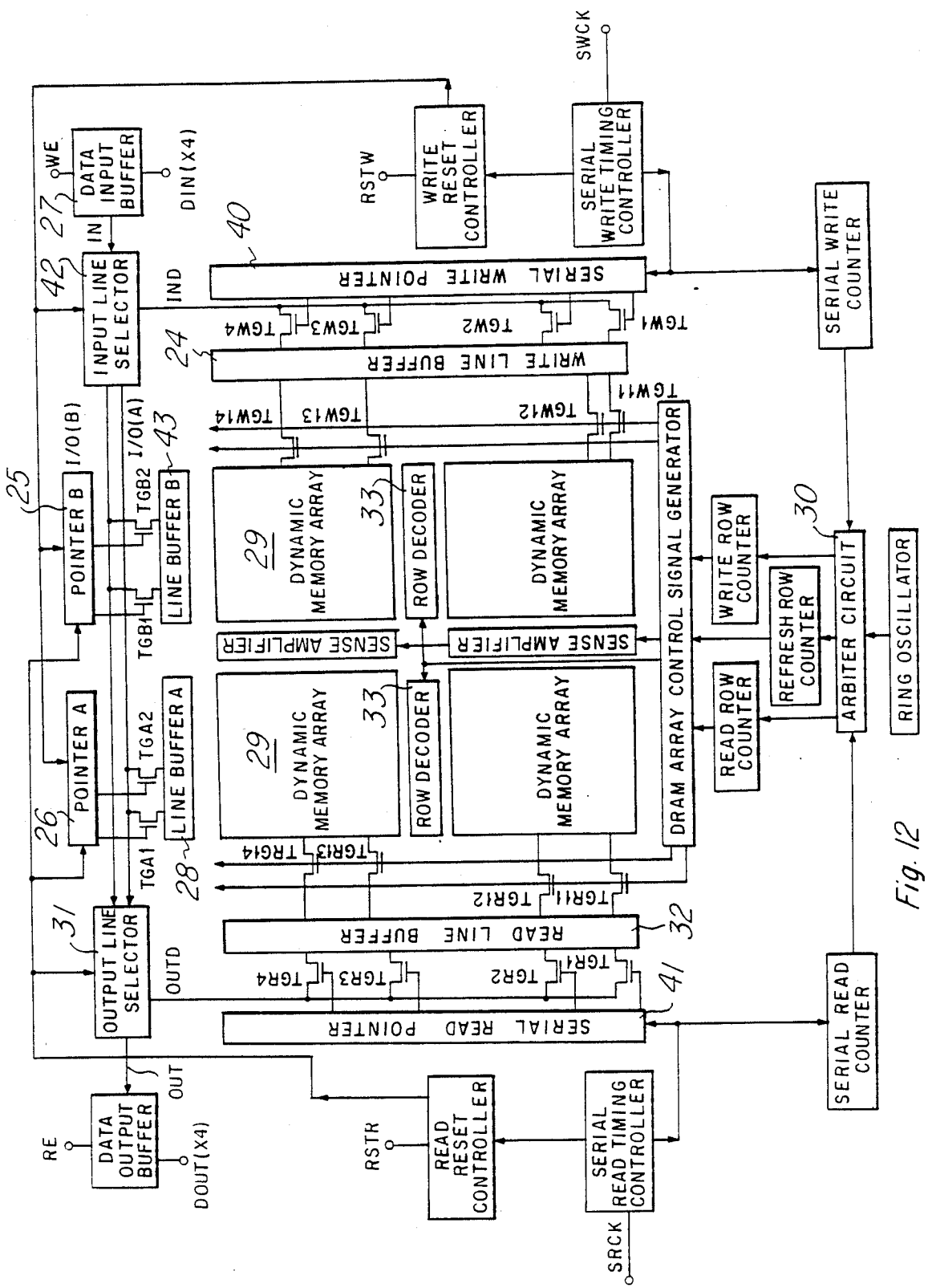

FIG. 12 shows a FIFO memory which is constructed so that a set of data is readout in the sequence written in it to which any of the above-mentioned synchronous circuits can be applied.

In this FIFO memory, any synchronous circuit according to the present invention can perform its characteristic function if connected between a serial read counter and an arbiter circuit and between a serial write counter and the arbiter circuit, respectively, because each counter asynchronously outputs. Thus the synchronous circuit enables the transmission of signals to the arbiter circuit without inducing erroneous operation.

In the following the description will be given of the procedure of operation of the FIFO memory device, wherein data write and readout shall be carried out usually independently of each other unless otherwise specified.

Referring to FIG. 12, as long as the external input signal for controlling data-write "WE" stays high level, "H", input data through $D_{in}$ is written as effective data into the device. $D_{in}$ denotes data input terminal; WRST, write reset signal with the rising edge defining the first address of data; and SWCK, write cycle time regulating clock.

As long as RE, which denotes external input signal for controlling data output, keeps "H", data is read out from $D_{out}$ in synchronism with SRCK.

RRST denotes input signal with the rising edge defining the first address of data.

Data write operation (1) When WRST signal is caused to change from low level, "L", to "H", the data write address is reset to zero, and the device begins a set of operations: the concerned circuit detects the rising edge of WRST and signaled to an input line selector 42, which then operates so that I/O(A) is connected to IN and I/O(B) and IND get disconnected from line IN. Simultaneously, data transfer gates $T_{GB1}$ and $T_{GB2}$ of a line buffer B 43 are turned OFF the line I/O(B) and also data transfer gates $T_{GW1}$ through $T_{GW4}$ of a write line buffer 24 are turned OFF the line IND. Thus a pointer B 25 and a serial write pointer 40 become reset while a pointer A 26 indicates the address "0", that is, the data transfer gate $T_{GA1}$ now turns ON. As the result, data transmitted from a data input buffer 27 via the lines IN and I/O(A) to the line buffer A 28, and written at address "0" of it.

(2) In synchronism with SWCK clock, data is sequentially written successive address of line buffer A 28.

(3) As a line buffer A 28 gets full with data written at all the available address thereof, a data transmission route switching request is sent from a pointer A 26 to the input line selector 42, which changes the connection of the line IN from the line I/O(A) into the line IND.

(4) In synchronism with SWCK clock, the serial write pointer 40 sequentially turns ON data transfer gates $T_{GW1}$ through $T_{GW4}$ of the write line buffer 24 so that input data from the $D_{IN}$ is written in the write line buffer 24.

(5) The moment the serial write pointer 40 turns ON the $T_{GW3}$, a write request signal "WRQ" is generated and transmitted to an arbiter circuit 30 to write the data stored in the first half of the write line buffer 24 into a dynamic memory array 29.

(6) Subsequently, by increment of the row decoder address one by one, serial write of data can continue until the maximum capacity of DRAM.

If generated in the course of this, another WRST signal is likewise transmitted to the input line selector 42, but with the result of the connection of I/O(B) to the line IN and the turn-OFF of the lines I/O(A) and IND from the line IN. When line buffer B 43 thus gets full with data written at all the available addresses, like under the previous (3), the line I/O(B) is turned OFF the line IN, and the line IND is connected to the line IN, thus data write proceeding as mentioned above.

Upon input of the next WRST signal, the line IN is connected to the line I/O(A). As understood from the above-stated, connection of the line I/O(A) or I/O(B) to the line IN is switched every input WRST signal which acts as if a toggle switch.

Both line buffers A 28 and B 43 are composed of fullstatic memory elements, the reason for which will be given in the following description of the data read operation in which the construction is involved more closely.

Data readout operation

Data read operation will be described below:

(1) RRST signal is changed from "L" to "H" to reset the data read address to zero inside the device. Internally, the edge of the RRST signal is detected and signaled to the output line selector 31 and arbiter circuit 30. Then the output line selector 31 connects either the line I/O(A) or I/O(B) to the line OUT. When data is being written through one of them, connection to the other can be established. This means retrieval of readout of old data when the time interval between WRST and RRST signals is within a predetermined range, and, as mentioned later, is useful for preventing conflict with the readout operation of data stored in the dynamic type main memory element portion. In the case where neither the line I/O(A) nor I/O(B) is connected to the line IN, one of these that has been used by the last WRST signal is connected to the line OUT. This means readout of new data, that is, the same data will be always repeatedly read out until the next WRST signal is generated. Owing to an external signal input by the operator, generation of RRST signal is out of the predictable range. For quick response to RRST signal is suitable static memory which allows to read data fast, and is adopted in the present example. Though the static type memory design lowers the degree of circuit integration, it gives a negligibly small effect on the total dimensions of the device, taking into consideration that the line buffers A 28 and B 43 may have a memory capacity of around 100 bits.

On the other hand, RRST signal transmitted to arbiter circuit 30 generates a read request signal RRQ, in response to the signal, necessary data being read from dynamic memory array 29 into a readout line buffer 32 within a necessary time interval, thereby the readout of these data can follow the current readout, just after completion of readout of all the data from line buffer a 28 or B 43.

(2) In synchronism with the clock SRCK from the line buffer A 28 or B 43, data is serially read out until the last address of it.

(3) A data transmission route switch request is then transmitted from pointer A 26 or B 25 to the output line selector 31 to connect the line OUTD to the line OUT.

(4) since the first half of the readout line buffer 32 has been loaded with data to be read out already at the step (1), data is now continuously read out through the line OUT without any interruption. The moment the read pointer 41 turns ON the $T_{GR1}$, another read request RRQ is generated and applied to arbiter circuit 30 to readout necessary data from dynamic memory array 29 to the second half of the readout line buffer 32.

It is noted that the same serial data can be read out every input of the signal RRST.

The description of the basic operation has been now completed.

With an ideal FIFO memory, data readout and write could have been completely asynchronously. Owing to the limited memory capacity associated with the actual device, however data readout and write cannot carried out without any restriction.

For easier understanding of reading video data into FIFO memory device according to the invention and reading-out it from the device, an explanation will be given by way of an example. It is herein assumed that this memory device has a memory capacity corresponding to a frame of video data (In Japan the NTSC system is adopted that a frame of video screen image is composed of 525 scanning lines).

As a frame of video data is sequentially written from the first to the last data thereof, the above memory device gets full. If further video data is input serially to the device, overwrite is carried out successively from the top address to create the second frame. Of course, if the WE signal is set to "low" to prohibit data write of the second and subsequent frames, the first frame of video data is kept stored and the same data can be read out repeatedly in the same data readout procedure.

The above-explained circuit configuration of FIG. 12 may be modified very readily, for example, so that when the memory gets full, this can be signaled from the inside to the operator, or so that the same internal state as at low level of signal WE may be created, thereby overwrite can be prevented.

With the configuration of FIG. 12, in the case data is written continuously as mentioned above, either the preceding frame (old data) or the current frame (new data) that is being written can be readout under the timing of the RRST signal relative to the last WRST siganl. The timing interval is determined in accordance with the memory capacity of line buffers A or B. For example, if a RRST signal is generated within 100 SWCK clock cycles after the output of WRST signal, on assumption that buffer A has a memory capacity of 100 bits, then readout of old data results.

Generation of a RRST signal after more than 100 SWCK clock cycles following the output of a WRST signal does not always retrieve readout of new data.

Alternatively the times taken for data transfer from the write line buffer to the memory array and from the latter to the read line buffer are involved in.

In detail, letting the memory capacities of the write and read line buffers be each 200 bits, new data will be read out under the following conditions:

Assuming that the first 100 bits of the new frame data are written in line buffer A and the next 100 bits from 101th bit through 200th bit of the new frame data are written in the write line buffer at addresses 1 through 100. The moment the 201th bit is written at address 101 of the write line buffer, a write request WRQ is generated (as mentioned above). Since data transfer to the memory array has been already complete before the 301th bit is written, the output of a readout request RRQ for data transfer of 101th bit through 200th bit from the memory array to the read line buffer may be admitted, resulting in input of a RRST signal as mentioned above.

Namely new data can be retrieved to be read out if a signal RRST is output after more than 300 SWCK clock cycles following the generation of a WRST signal (after 300 bits of data have been written).

It must not to be allowed for RRST signal to output within the range of 100 to 300 SWCK clock cycles after generation of the last WRST signal because determination whether the old or new data shall be readout is impossible in this time range.

Since data write and readout can be performed asynchronously, the clock pulse widths of SWCK and SRCK can be changed freely. Also in this case, assuming that SWCK and SRCK at occurrence of WRST and RRST are of 0 cycle, respectively. No confusion can occur mixing of old and new datas, so far as clocks SWCK and SRCK are set to such pulse widths that the request of $m-n \leq 100$ or $m-n \geq 300$ is always met, wherein m is the mth cycle of SWCK and n is the nth cycle of SRCK.

As apparent from the above-described circuit configuration, basically the same procedure as known VRAMs can be applied to incorrect-bit relief circuits, and thus its explanation is omitted.

It will be evident that various modification can be made to the described embodiments without departing from the scope of the present invention.

For example, construction and elements of the above-stated circuit may be modified or changed.

Moreover, the present invention can be applied, for example, to micro computers capable of receiving external stopping signals and field memories.

The present invention, as described above, has the feature that there are provided with not only a latch circuit for latching input for the switch circuit, but also a signal transmission circuit and a feedback circuit, which have been described above, and therefore makes it possible for stable operation to be made rapidly; and that change in input potential due to the feedback can be prevented by the signal transmission circuit holding its state as before until necessary input level is reached, thereby without generating causative pulses for erroneous operation.

What is claimed is:

1. A synchronous circuit system comprising:
   switch circuit means having an input for receiving an asynchronous input signal and being responsive to a synchronizing signal for transmitting said asynchronous input signal only within a specified time period as determined by the logic state of the synchronizing signal;
latch circuit means connected to said switch circuit means for receiving said asynchronous input signal when transmitted by said switch circuit means and latching the data imparted by said asynchronous input signal in a logic state of one of a high logic state and a low logic state;
signal transmission circuit means connected to the output of said latch circuit means and holding the logic state of the latched data until a predetermined input level of said asynchronous input signal is attained for reception by said latch circuit means, said signal transmission means providing an output; and
feedback circuit means connected between the output of said signal transmission circuit means and the output of said switch circuit means to enable stable operation to be accomplished even though an asynchronous input signal may appear at the only unstable point in said latch circuit means.

2. A synchronous circuit system as set forth in claim 1, wherein said signal transmission circuit means comprises a Schmitt-trigger circuit means.

3. A synchronous circuit system as set forth in claim 2, wherein said switch circuit means includes an MOS transistor having a gate and being rendered conductive in response to a predetermined logic state of a synchronizing signal applied to said gate for transmitting said asynchronous input signal only during the time said MOS transistor is conductive.

4. A synchronous circuit system as set forth in claim 2, wherein said latch circuit means comprises a pair of inverters connected together in a positive feedback connection to the output of said switch circuit means; and
said feedback circuit means including a second MOS transistor having a gate, said second MOS transistor being connected to the positive feedback connection of said latch circuit means at the output of said switch circuit means.

5. A synchronous circuit system as set forth in claim 4, wherein one of said inverter pair of said latch circuit means receiving the output of said switch circuit means has a threshold voltage ($V_{th1}$) higher than ½ of the voltage ($V_{DD}$) applied to said synchronous circuit system, and the other inverter of said latch circuit means has a threshold voltage ($V_{th2}$) lower than ½ of the voltage ($V_{DD}$); and
the threshold voltage ($V_{th3}$) of said Schmitt-trigger circuit means is set to be higher than the threshold voltage of said other inverter ($V_{th2}$) of said latch circuit means and to be $>\frac{1}{2}$ of the voltage ($V_{DD}$).

6. A synchronous circuit system as set forth in claim 5, further including a third inverter connected to the output of said Schmitt-trigger circuit means;
an MOS output transistor connected to said third inverter at the output of said Schmitt-trigger circuit means; and
said feedback circuit means further including a fourth inverter and a feedback conductor line, said feedback conductor line being connected at one end thereof between the third inverter at the output of said Schmitt-trigger circuit means and said MOS output transistor and at the other end thereof to said output of said switch circuit means and having said fourth inverter and said second MOS transistor serially disposed therein.

7. A synchronous circuit system as set forth in claim 4, wherein one of said inverter pair of said latch circuit means receiving the output of said switch circuit means has a threshold voltage ($V_{th1}$) lower than ½ of the voltage ($V_{DD}$) applied to said synchronous circuit system, and the other inverter of said latch circuit means has a threshold voltage ($V_{th2}$) higher than ½ of the voltage ($V_{DD}$); and
the threshold voltage ($V_{th3}$) of said Schmitt-trigger circuit means is set to be lower than the threshold voltage of said other inverter ($V_{th2}$) of said latch circuit means and to be $<\frac{1}{2}$ of the voltage ($V_{DD}$).

8. A synchronous circuit system as set forth in claim 7, further including a third inverter connected to the output of said Schmitt-trigger circuit means;
an MOS output transistor connected to said third inverter at the output of said Schmitt-trigger circuit means; and
said feedback circuit means further including a fourth inverter and a feedback conductor line, said feedback conductor line being connected at one end thereof between the third inverter at the output of said Schmitt-trigger circuit means and said MOS output transistor and at the other end thereof to said output of said switch circuit means and having said fourth inverter and said second MOS transistor serially disposed therein.

9. A synchronous circuit system comprising:
switch circuit means having an input for receiving an asynchronous input signal and including a CMOS transistor responsive to a synchronizing signal for being rendered conductive to transmit said asynchronous input signal only within the time period that said CMOS transistor is conductive;
latch circuit means connected to said switch circuit means for receiving said asynchronous input signal when transmitted by said switch circuit means and comprising a pair of inverters connected together in a positive feedback connection to the output of said switch circuit means for latching the data imparted by said asynchronous input signal in a logic state of one of a high logic state and a low logic state; and
feedback circuit means connected between the output of said latch circuit means and the output of said switch circuit means to enable stable operation to be accomplished even though an asynchronous input signal may appear at the only unstable point in said latch circuit means, said feedback circuit means including an inverter having a high threshold voltage, a CMOS transistor, and a feedback conductor line, said feedback conductor line being connected between the output of said latch circuit means and the output of said switch circuit means and having said inverter and said CMOS transistor of said feedback circuit means serially disposed therein.

10. A synchronous circuit system as set forth in claim 9, further including an MOS output transistor connected to the output of said latch circuit means and having a gate responsive to a signal applied thereto for being rendered conductive to transmit the output from said latch circuit means as an output signal.

11. A snychronous circuit system as set forth in claim 10, wherein the signal applied to the gate of said MOS output transistor is a control signal different from the synchronizing signal.

* * * * *